United States Patent
Johansen et al.

(10) Patent No.: US 9,266,713 B2
(45) Date of Patent: Feb. 23, 2016

(54) MEMS BACKPLATE, MEMS MICROPHONE COMPRISING A MEMS BACKPLATE AND METHOD FOR MANUFACTURING A MEMS MICROPHONE

(75) Inventors: Leif Steen Johansen, Kgs. Lyngby (DK); Jan Tue Ravnkilde, Hedehusene (DK); Pirmin Hermann Otto Rombach, Kongens Lyngby (DK); Kurt Rasmussen, Herlev (DK); Dennis Mortensen, Frederiksberg C (DK)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/261,882

(22) PCT Filed: Nov. 14, 2011

(86) PCT No.: PCT/EP2011/070067
§ 371 (c)(1),
(2), (4) Date: Aug. 13, 2014

(87) PCT Pub. No.: WO2013/071950
PCT Pub. Date: May 23, 2013

(65) Prior Publication Data
US 2014/0346621 A1    Nov. 27, 2014

(51) Int. Cl.
*B81B 3/00* (2006.01)
*H04R 19/00* (2006.01)
*B81C 1/00* (2006.01)
*H04R 31/00* (2006.01)

(52) U.S. Cl.
CPC .......... *B81B 3/0086* (2013.01); *B81C 1/00158* (2013.01); *B81C 1/00698* (2013.01); *H04R 19/005* (2013.01); *H04R 31/006* (2013.01); *H04R 2201/003* (2013.01); *Y10T 428/24273* (2013.01)

(58) Field of Classification Search
CPC ........................... B81B 3/0086; H04R 31/006
USPC ............. 257/416; 428/131; 438/53; 381/174, 381/175
See application file for complete search history.

(56) References Cited

U.S. PATENT DOCUMENTS

| | | | |
|---|---|---|---|
| 2007/0201710 A1* | 8/2007 | Suzuki et al. | 381/174 |
| 2009/0169035 A1* | 7/2009 | Rombach et al. | 381/175 |
| 2011/0075865 A1 | 3/2011 | Yang et al. | |
| 2012/0091545 A1 | 4/2012 | Reichenbach et al. | |

FOREIGN PATENT DOCUMENTS

| | | |
|---|---|---|
| JP | 2007243768 A | 9/2007 |
| JP | 2010098454 A | 4/2010 |
| WO | 2007100068 A1 | 9/2007 |

OTHER PUBLICATIONS

Examination Report received in JP 2014540328, mailed Jun. 3, 2015 (with partial English Translation), 5 pages.

* cited by examiner

*Primary Examiner* — Cuong Q Nguyen
*Assistant Examiner* — Tong-Ho Kim
(74) *Attorney, Agent, or Firm* — Slater & Matsil, L.L.P.

(57) ABSTRACT

A MEMS backplate enables MEMS microphones with reduced parasitic capacitance. The MEMS backplate includes a central area and a perforation in the central area. A suspension area surrounds the central area at least partially. An aperture is disposed in the suspension area.

5 Claims, 2 Drawing Sheets

MEMS BACKPLATE, MEMS MICROPHONE COMPRISING A MEMS BACKPLATE AND METHOD FOR MANUFACTURING A MEMS MICROPHONE

This patent application is a national phase filing under section 371 of PCT/EP2011/070067, filed Nov. 14, 2011, which is incorporated herein by reference in its entirety.

TECHNICAL FIELD

The present invention relates to MEMS backplates, MEMS microphones with reduced parasitic capacitance and a method for manufacturing such microphones.

BACKGROUND

MEMS microphones usually comprise a conductive backplate and a conductive, flexible membrane being arranged at a distance from the backplate. The backplate and the membrane realize electrodes of a capacitor. When a bias voltage is applied to the electrodes, oscillations of the membrane caused by received acoustic signals are converted into electrical signals. For further signal processing MEMS-microphones can comprise an ASIC (Application-specific Integrated Circuit) chip.

Such microphones have a central, acoustically active area and a suspension area. The central area is surrounded by the suspension area that is acoustically inactive. Within the suspension area, suspension means for mechanically and/or electrically connecting the backplate and/or the membrane are arranged on a substrate material. For constructing MEMS microphones, manufacturing processes of semiconductor devices such as layer deposition, deposition of photo resist films, structuring photoresist films, and partly removing structured layers can be utilized. As a consequence of the necessity for suspension means the capacitor—apart from the central area—has an acoustically inactive area deteriorating the signal quality of the microphone. This deterioration is due to parasitic capacitance. The corresponding signal attenuation $H_c$ is:

$$H_c = C_m/(C_m + C_i + C_p), \quad (1)$$

where $C_i$ is the input capacitance of an according ASIC chip processing the electrical signal. $C_p$ is the parasitic capacitance, i.e., the capacitance of the capacitor's acoustically inactive area. $C_m$ is the total capacitance comprising the capacitance of the central area and the capacitance of the suspension area. Reducing the parasitic capacitance reduces the signal's deterioration and, thus, improves the microphone's signal quality.

$C_p$ mainly depends on the acoustically inactive suspension area of the backplate overlapping a suspension area of the membrane.

SUMMARY OF THE INVENTION

Embodiments of the present invention provide a MEMS backplate that can be used in a MEMS microphone having reduced parasitic capacitance, a MEMS microphone with reduced parasitic capacitance and a method for manufacturing such a microphone.

A MEMS backplate comprises a central area, a perforation in the central area, a suspension area, and an aperture in the suspension area. The suspension area surrounds the central area at least partially.

In this context, the phrase "perforation" refers to holes in the central area while "apertures" refers to holes in the suspension area of the MEMS backplate. Both categories of holes can be arranged in a regular pattern such as a quadratic pattern or a hexagonal pattern or in an irregular pattern. It is also possible that additional holes at irregular lattice places can be added to the holes of a regular pattern. Such additional holes can have a bigger or smaller diameter. The apertures can be larger than the holes of the perforation, or vice-versa. It is also possible that the apertures have the same size as the holes of the perforation.

The unwanted parasitic capacitance depends on the amount of the acoustically inactive area, i.e., the suspension area, of the backplate and of the membrane. Further, the capacitance depends on the dielectric constant of the material in-between these electrodes.

An aperture in the suspension area of the backplate reduces the acoustically inactive but electrically active amount of conductive area of the backplate resulting in an improved signal quality of the respective MEMS microphone.

The suspension area can comprise two or more, e.g., a plurality of, apertures in the suspension area.

It was found that such a MEMS backplate reduces the parasitic capacitance of a respective MEMS microphone and a mechanically stable microphone can be obtained although the area for suspending the backplate is reduced.

Further, it was found that apertures in the suspension area of the backplate enable methods for manufacturing MEMS microphones with further reduced parasitic capacitances while maintaining the mechanical stability.

In one embodiment, the suspension area surrounds the central area completely. Then, a MEMS backplate is provided that enables an optimal mechanical stability of a respective MEMS microphone.

The MEMS backplate and/or the respective membrane can have a circular or an elliptic shape. It is further possible that the MEMS backplate and the membrane have a rectangular or a quadratic shape.

In one embodiment, the suspension area comprises a plurality of apertures.

In one embodiment, the MEMS backplate comprises a plurality of apertures which are comprised in aperture sections. Thus, the apertures are concentrated in the aperture sections while other sections of the suspension area do not comprise apertures and maintain their mechanical stiffness required for a stable suspension.

Thus, the MEMS backplate can be optimized with respect to electric capacitance and mechanical stability.

In one embodiment, the MEMS backplate has aperture sections which are arranged in equal distances with respect to their neighboring aperture sections. Thus, the aperture sections can be arranged in a symmetric pattern within the suspension area.

A MEMS microphone can comprise one of the above mentioned backplates. The microphone can further comprises a substrate, a membrane, and an anchor element. The membrane is arranged between the substrate and the anchor element. The backplate suspension area is connected to the anchor element.

In one embodiment, the anchor element comprises connection sections. The suspension area of the MEMS backplate comprises aperture sections, each comprising at least one aperture. The connection sections of the anchor element are connected to the backplate suspension area. The backplate aperture sections are, then, arranged above cavities within the anchor element. Corresponding to a symmetry of the arrangement of the aperture sections of the suspension section the connection elements can be arranged using the same symmetry but an offset relative to the pattern of the aperture sections.

It was found that the parasitic capacitance can be reduced by establishing cavities within the anchor element which can comprise dielectric material. The parasitic capacitance depends on the dielectric constant of the anchor element. The absence of dielectric material of the anchor element within the cavities reduces, thus, the parasitic capacitance as vacuum or an ambient atmosphere has a lower dielectric constant than the anchor element's material. As the anchor element still comprises connection sections being connected to the backplate suspension area, a mechanically stable microphone is obtained.

Thus, in one embodiment, the cavities are arranged within the anchor element.

A method for manufacturing a MEMS microphone comprises the steps:
providing a substrate,
structuring a membrane on the substrate,
structuring an anchor element on the membrane,
structuring a backplate on the anchor element creating a perforation in a central area of the backplate and creating apertures in a suspension area of the backplate,
removing material of the anchor element in a region below the apertures.

Thus, the apertures within the suspension area of the backplate not only reduce the electrically active area of the capacitor resulting in the parasitic capacitance. The apertures further allow to create cavities within the anchor element as they enable removing material of the anchor element during manufacturing of the MEMS microphone through the aperture holes.

It is possible that material of the anchor element between the backplate and the membrane is removed while material of the anchor element below the aperture sections is removed.

In one embodiment of the method, material of the anchor element is removed using a VHF (Vapor Hydro-Fluoric) etching environment.

BRIEF DESCRIPTION OF THE DRAWINGS

The basic idea of the invention and embodiments are shown in the schematic figures.

DETAILED DESCRIPTION OF ILLUSTRATIVE EMBODIMENTS

Figure 1:
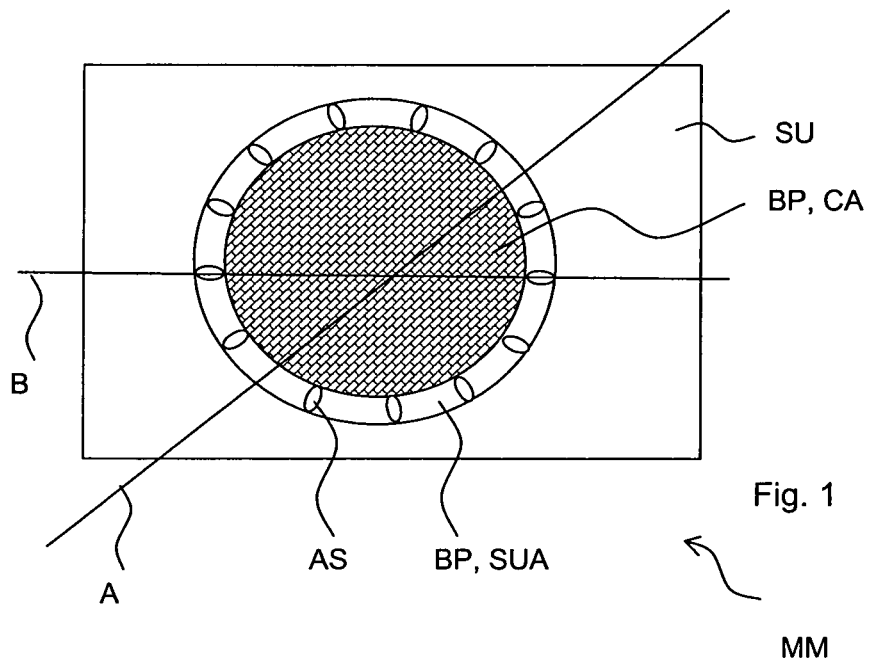
FIG. 1 shows a top view onto a MEMS microphone indicating the positions of cross-section A and cross-section B.
Figure 3:
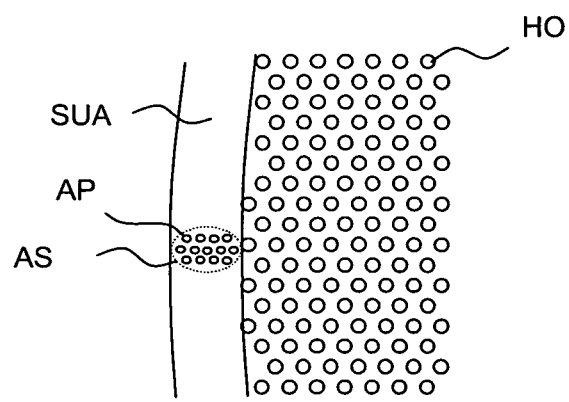
FIG. 3 shows an enlarged view of the rim of a backplate.
Figure 3:

FIG. 1 shows a top view of a MEMS microphone MM. The microphone MM comprises a substrate SU on which a backplate BP is arranged. Backplate BP comprises a central area CA and a suspension area SUA. The suspension area SUA surrounds the central area CA. The central area CA is the acoustically active area of the backplate BP while the suspension area SUA is acoustically inactive and, due to the contribution of the parasitic capacitance $C_P$ in equation (1), generally deteriorates the microphone's signal quality. However, the backplate BP comprises aperture sections AS within the suspension area SUA. The aperture sections AS comprise apertures as shown in FIG. 3. Due to the apertures in the aperture sections AS, the acoustically inactive but electrically active suspension area SUA is reduced. Thus, parasitic capacitance $C_p$ is reduced.

Further, the apertures in the aperture sections AS allow to create MEMS microphones with further reduced parasitic capacitances: during a manufacturing step, material of an anchor element below the backplate BP can be removed via the apertures of the aperture sections. This is shown in FIGS. 2A and 2B which illustrate cross-sections A, B.

The aperture sections AS can be arranged in equal distances with respect to their neighboring aperture sections AS.

Figure 2A:
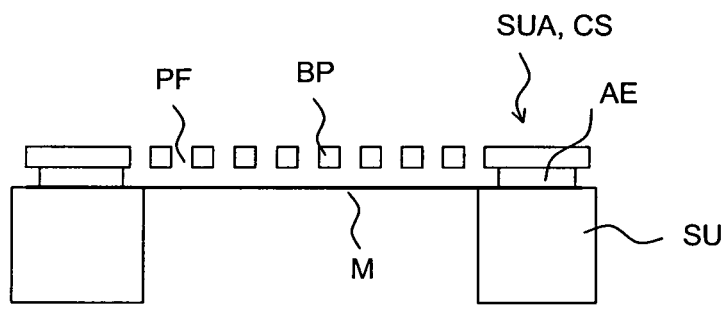
FIG. 2A shows cross-section A indicated in FIG. 1.

FIG. 2A shows cross-section A illustrated in FIG. 1. The MEMS microphone comprises a membrane M being arranged on substrate SU. An anchor element AE is arranged on membrane M. The backplate BP is arranged on the anchor element AE. Connection sections CS of the anchor element AE are connected to the suspension area SUA of backplate BP. Thus, a mechanically stable connection between the backplate BP and the body of the microphone is obtained. A perforation PF of the acoustically active region of the backplate BP comprises holes.

Figure 2B:
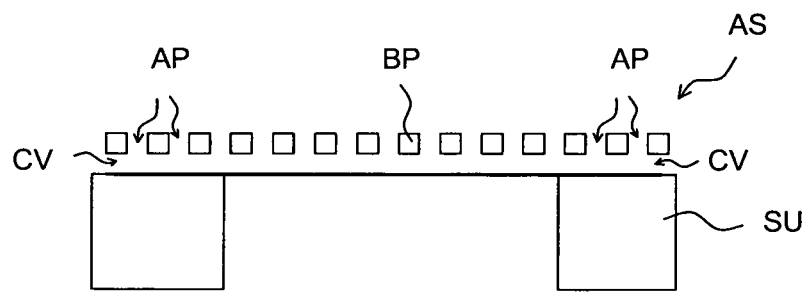
FIG. 2B shows the cross-section B indicated in FIG. 1.

FIG. 2B shows cross-section B illustrated in FIG. 1. Cross-section B intersects aperture sections AS within the suspension area SUA.

The aperture sections AS comprise apertures AP. Below the apertures AP, material of the anchor element AE, shown in FIG. 2A, is removed. Thus, cavities CV below the aperture sections AS are obtained. Correspondingly, the parasitic capacitance is reduced as dielectric material having a larger dielectric constant than air or vacuum is replaced by air or vacuum within the cavities CV.

FIG. 3 shows an enlarged view of the rim of a backplate BP. The perforation PF comprises holes HO. Holes HO are arranged in a hexagonal pattern. However, other patterns such as rectangular or quadratic patterns or irregular patterns are also possible. Aperture section AS comprises a plurality of apertures AP. The aperture section AS, and thus the apertures AP, are arranged within the suspension area SUA which serves as a connection means to connect the backplate BP to the body of the MEMS microphone, e. g., via an anchor element AE.

The apertures AP within the aperture section AS can also be arranged in a hexagonal, rectangular, quadratic or irregular pattern. The aperture sections AS themselves can have a circular, rectangular, quadratic or irregular shape.

The holes HO of the perforation can be larger than the apertures within the aperture sections, or vice-versa. It is also possible that the apertures AP and the holes HO of the perforation PF have the same size.

It is possible that apertures AP and holes HO are created during the same manufacturing step.

Figure 4:
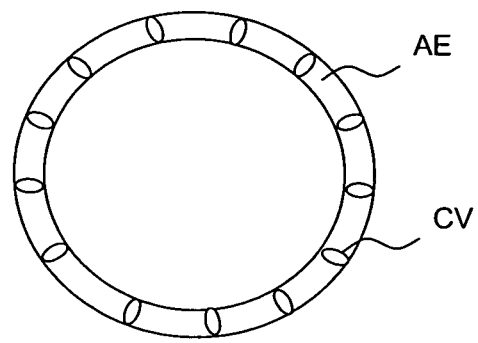
FIG. 4 shows an anchor element comprising cavities.

FIG. 4 shows a circular shaped anchor element AE comprising cavities CV. The cavities CV reduce the average dielectric constant of the anchor element AE reducing the parasitic capacitance $C_p$. The position and size of cavities CV can be optimized with respect to mechanical stability and reduced parasitic capacitance simultaneously.

A MEMS backplate, a MEMS microphone or a method for manufacturing such microphones are not limited to the embodiments described in the specification or shown in the figures. Backplates comprising further structured elements and microphones comprising further layers and methods for manufacturing microphones comprising further manufacturing steps are also comprised by the present invention.

The invention claimed is:
1. A MEMS microphone comprising:
a MEMS backplate, comprising:
- a central area;
- a perforation in the central area;
- a suspension area that at least partially surrounds the central area, wherein the suspension area comprises aperture sections, and wherein the aperture sections are arranged above cavities;
- a plurality of apertures concentrated in the aperture sections of the suspension area while other sections of the suspension area are substantially solid and maintain their mechanical stiffness;

a substrate,
an anchor element arranged between the substrate and the MEMS backplate so as to directly or indirectly mechanically connect the substrate to the MEMS backplate, wherein the anchor element comprises connection sections that are connected to the backplate's suspension area, and the cavities are arranged within the anchor element; and
a membrane arranged between the substrate and the anchor element.

2. The MEMS microphone of claim 1, wherein the suspension area surrounds the central area completely.

3. The MEMS microphone of claim 1, wherein the aperture sections are arranged at equal distances with respect to their neighboring aperture sections.

4. A method for manufacturing a MEMS microphone, the method comprising:
providing a substrate;
structuring a membrane on the substrate;
structuring an anchor element on the membrane;
structuring a backplate on the anchor element, thereby perforating a central area of the backplate and creating a plurality of apertures concentrated in aperture sections in a suspension area of the backplate while other sections of the suspension area are substantially solid, wherein the aperture sections are positioned over cavities arranged in the anchor element and the anchor element is positioned between the substrate and the backplate so as to directly or indirectly mechanically connect the substrate to the suspension area of the backplate; and
removing material of the anchor element in a region below the apertures.

5. The method of claim 4, wherein material of the anchor element is removed using a VHF etching environment.

* * * * *